United States Patent
Li et al.

(10) Patent No.: US 11,233,201 B2
(45) Date of Patent: Jan. 25, 2022

(54) ORGANIC ELECTROLUMINESCENT DEVICES AND PREPARATION METHODS THEREOF

(71) Applicant: Kunshan Go-Visionox Opto-Electronics Co., Ltd., Kunshan (CN)

(72) Inventors: Weiwei Li, Kunshan (CN); Shengfang Liu, Kunshan (CN); Chao Min, Kunshan (CN); Lei Xu, Kunshan (CN); Xiaoyu Gao, Kunshan (CN); Xiuqi Huang, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 105 days.

(21) Appl. No.: 16/327,339

(22) PCT Filed: May 23, 2018

(86) PCT No.: PCT/CN2018/088066
§ 371 (c)(1),
(2) Date: Feb. 22, 2019

(87) PCT Pub. No.: WO2019/001182
PCT Pub. Date: Jan. 3, 2019

(65) Prior Publication Data
US 2020/0111960 A1    Apr. 9, 2020

(30) Foreign Application Priority Data
Jun. 30, 2017   (CN) .......................... 201710523910.1

(51) Int. Cl.
*H01L 51/00*    (2006.01)
*H01L 51/50*    (2006.01)
*H01L 51/56*    (2006.01)

(52) U.S. Cl.
CPC ........ *H01L 51/006* (2013.01); *H01L 51/0067* (2013.01); *H01L 51/0072* (2013.01);
(Continued)

(58) Field of Classification Search
None
See application file for complete search history.

(56) References Cited

U.S. PATENT DOCUMENTS 9,112,172 B2 *   8/2015   Kaiser ................... C09B 57/008
9,508,949 B2    11/2016   Jeong
(Continued)

FOREIGN PATENT DOCUMENTS

CN   1713786 A   12/2005
CN   1845355 A   10/2006
(Continued)

OTHER PUBLICATIONS

Bimstock et al., IMID/IDMC/Asia Display '08 Digest, 38-2, 2008, 1315-1318.*
(Continued)

*Primary Examiner* — Vu A Nguyen
(74) *Attorney, Agent, or Firm* — Kilpatrick Townsend & Stockton

(57) ABSTRACT

The present disclosure relates to an organic electroluminescent device and a preparation method thereof. The organic electroluminescent device includes a hole injection layer including a first doped layer and/or a second doped layer. The first doped layer includes a P-type dopant, and the second doped layer includes a P-type dopant and a hole transport material. The organic electroluminescent device includes a hole transport layer formed on the hole injection layer, and an electron blocking layer formed on the hole transport layer. A difference in HOMO energy level between the electron blocking layer and the hole transport layer is
(Continued)

Forming a hole injection layer including a first doped layer and/or a second doped layer, wherein the first doped layer includes a P-type dopant, and the second doped layer includes a P-type dopant and a hole transport material. — S10

Forming a hole transport layer on the hole injection layer. — S20

Forming an electron blocking layer on the hole transport layer, wherein a difference in HOMO energy level between the electron blocking layer and the hole transport layer is less than or equal to 0.2 eV. — S30 less than or equal to 0.2 eV. The power consumption of the organic electroluminescent device can be reduced. The lifetime of the mass production device therefore can be increased.

12 Claims, 3 Drawing Sheets

(52) U.S. Cl.
CPC ...... *H01L 51/0052* (2013.01); *H01L 51/5004* (2013.01); *H01L 51/5056* (2013.01); *H01L 51/5088* (2013.01); *H01L 51/5096* (2013.01); *H01L 51/56* (2013.01); *H01L 2251/552* (2013.01)

(56) References Cited

U.S. PATENT DOCUMENTS

| | | | |
|---|---|---|---|
| 10,374,168 | B2 | 8/2019 | Pfister et al. |
| 2003/0059647 | A1* | 3/2003 | Thompson ............. C09K 11/06 428/690 |
| 2006/0131562 | A1 | 6/2006 | Li |
| 2015/0001499 | A1 | 1/2015 | Kim et al. |
| 2015/0041787 | A1* | 2/2015 | Malik ................. H01L 51/0039 257/40 |
| 2015/0171361 | A1 | 6/2015 | Khalifa et al. |
| 2015/0270315 | A1 | 9/2015 | Takasu et al. |
| 2015/0270506 | A1 | 9/2015 | Voges et al. |
| 2016/0149153 | A1 | 5/2016 | Scharner et al. |
| 2016/0248015 | A1 | 8/2016 | Stoessel |
| 2016/0248030 | A1 | 8/2016 | Zhang |
| 2016/0308146 | A1 | 10/2016 | Parham et al. |
| 2017/0077419 | A1 | 3/2017 | Kim et al. |
| 2017/0125701 | A1 | 5/2017 | Pfister et al. |
| 2017/0346032 | A1 | 11/2017 | Ma et al. |
| 2018/0114916 | A1 | 4/2018 | Hayashi |
| 2018/0138439 | A1 | 5/2018 | Voges et al. |
| 2018/0219156 | A1* | 8/2018 | Mujica-Fernaud .......................... H01L 51/0052 |

FOREIGN PATENT DOCUMENTS

| | | |
|---|---|---|
| CN | 100593357 C | 3/2010 |
| CN | 102214801 A | 10/2011 |
| CN | 103187537 A | 7/2013 |
| CN | 104205392 A | 12/2014 |
| CN | 104241540 A | 12/2014 |
| CN | 104253235 A | 12/2014 |
| CN | 104471735 A | 3/2015 |
| CN | 104538559 A | 4/2015 |
| CN | 106848084 A | 6/2017 |
| EP | 3242343 A1 | 11/2017 |
| JP | 2014022255 A | 2/2014 |
| JP | 2015195333 A | 11/2015 |
| JP | 2016500917 A | 1/2016 |
| JP | 2017501142 A | 1/2017 |
| JP | 2017513855 A | 6/2017 |
| KR | 20160065157 A | 6/2016 |
| KR | 20160143821 A | 12/2016 |
| TW | 201417369 A | 5/2014 |
| WO | 2016163276 A1 | 10/2016 |
| WO | 2017016632 A1 | 2/2017 |

OTHER PUBLICATIONS

Office Action of JP Patent Application No. 2019-544684.
European Search Report of EP Patent Application No. 18825159.9 dated Mar. 10, 2020.
Office Action of Chinese Patent Application No. 201710523910.1 dated Jun. 2, 2020.
CN First Office Action dated May 20, 2019 in the corresponding CN application (application No. 201710523910.1).
TW Office Action dated May 15, 2019 in the corresponding TW application (application No. 107118555).
Notice of Allowance of JP Patent Application No. 2019-544684.
Office Action of KR Patent Application No. 10-2019-7023719.
International Search Report dated Aug. 22, 2018 in the corresponding PCT application (application No. PCT/CN2018/088066).

\* cited by examiner

ORGANIC ELECTROLUMINESCENT DEVICES AND PREPARATION METHODS THEREOF

CROSS-REFERENCE TO RELATED APPLICATIONS

This application is a U.S. national Stage of International Application No. PCT/CN2018/088066, filed on May 23, 2018, designating the United States, which claims priority to Chinese Patent Application No. 201710523910.1, filed with the Chinese Patent Office on Jun. 30, 2017 and entitled "ORGANIC ELECTROLUMINESCENT DEVICE AND MANUFACTURING METHOD THEREOF", the content of each of which is hereby incorporated by reference in its entirety.

TECHNICAL FIELD

The present disclosure relates to the technical field of light emitting device, and particularly relates to an organic electroluminescent device and preparation method thereof.

BACKGROUND

Organic electroluminescence refers to the phenomenon that an organic light-emitting material emits light under the excitation of current or an electric field. The organic electroluminescent device (e.g., Organic Light-Emitting Diode, OLED) has many advantages such as active illumination, high luminous efficiency, short response time (in order of Ips), low operating voltage (3 v~10 v), large viewing angle (175° or more), thin panel thickness (<1 mm), low power consumption, a broad range of operating temperature (−40° C. to +85° C.), and capable of realizing flexible display, and so on, therefore, it has attracted a lot of attention.

The lifetime of the conventional organic electroluminescent device declines seriously after being introduced into mass production, and the lifetime of LT97 is usually less than 180 hours, which is not conducive to application.

SUMMARY

Based on this, it is necessary to provide an organic electroluminescent device capable of increasing the lifetime and a preparation method thereof for solving the problem that the lifetime of the conventional organic electroluminescent device seriously declines.

According to one aspect of the present disclosure, there is provided an organic electroluminescent device including:

a hole injection layer, including a first doped layer or a second doped layer, wherein the first doped layer includes a P-type dopant, and the second doped layer includes a P-type dopant and hole transport material;

a hole transport layer formed on the hole injection layer; and an electron blocking layer formed on the hole transport layer, wherein a difference in HOMO energy level between the electron blocking layer and the hole transport layer is less than or equal to 0.2 eV.

In the above organic electroluminescent device, the P-type dopant in the first doped layer can increase hole injection amount, thereby increasing the lifetime of the mass production device; in the second doped layer, it can control hole injection amount by adjusting the doping concentration of the P-type dopant, thereby adjusting the balance of electrons and holes, and increasing the lifetime of the mass production device accordingly. Moreover, a difference in HOMO energy level between the electron blocking layer and the hole transport layer is less than or equal to 0.2 eV, which can reduce the power consumption of the organic electroluminescent device, thereby increasing the lifetime of the mass production device.

In one embodiment, in the second doped layer, the P-type dopant has a doping concentration of 3 wt %~ 8 wt %.

In one embodiment, the hole injection layer includes the first doped layer and the second doped layer formed on the first doped layer, the second doped layer is adjacent to the hole transport layer.

In one embodiment, the hole injection layer includes the second doped layer and the first doped layer formed on the second doped layer, the first doped layer is adjacent to the hole transport layer.

In one embodiment, when the hole injection layer includes only the first doped layer, the first doped layer has a thickness of 5 nm to 20 nm; when the hole injection layer includes only the second doped layer, the second doped layer has a thickness of 10 nm to 30 nm; when the hole injection layer includes the first doped layer and the second doped layer simultaneously, the first doped layer has a thickness of 1 nm to 10 nm, and the second doped layer has a thickness of 10 nm to 20 nm.

In one embodiment, the P-type dopant is selected from at least one of NDP-2 and NDP-9.

In one embodiment, the hole transport material and the material of the hole transport layer are independently selected from at least one of the structures shown by the formulas (1) and (2):

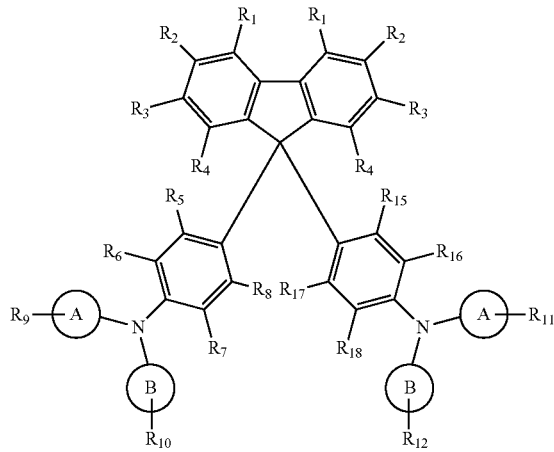

Formula (1)

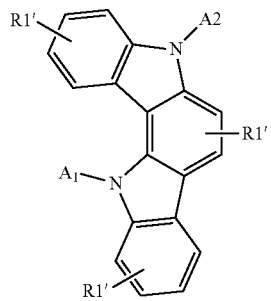

Formula (2)

wherein, A and B in the formula (1) are each independently selected from the group consisting of phenyl, naphthyl or anilino;

$R_1$, $R_2$, $R_3$, $R_4$, $R_5$, $R_6$, $R_7$, $R_8$, $R_{15}$, $R_{16}$, $R_{17}$ and $R_{18}$ are each independently selected from one of hydrogen, halogen, CN, $NO_2$, amino, C6-C30 sub-fused ring aryl, C6-C30 sub-fused heterocyclic aryl, C6-C20 alkyl, and C6-C30 alcohol group;

$R_9$, $R_{10}$, $R_{11}$ and $R_{12}$ are each independently selected from one of hydrogen and C6-C30 aryl;

A1 and A2 in the formula (2) are each independently selected from one of C6-C30 aryl and substituted or unsubstituted C6-C30 heterocyclic aryl, and R1' is selected from one of hydrogen, alkyl, alkoxy and base;

and the formula (2) meets the condition that at least one of A1 and A2 has a constricted ring structure.

In one embodiment, the material of the electron blocking layer is selected from at least one of the indenofluorene derivatives having structures shown by the formulas (3), (4), (5), and (6):

Formula (3)

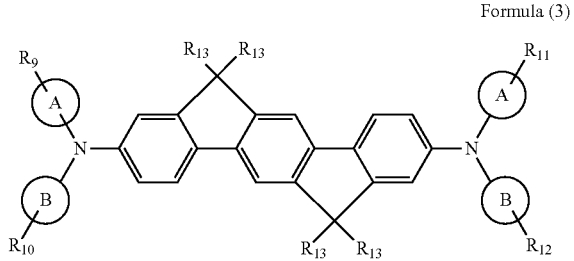

Formula (4)

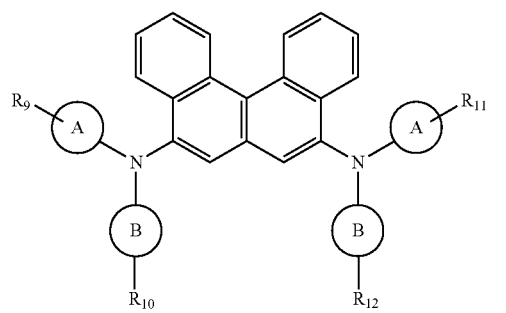

Formula (5)

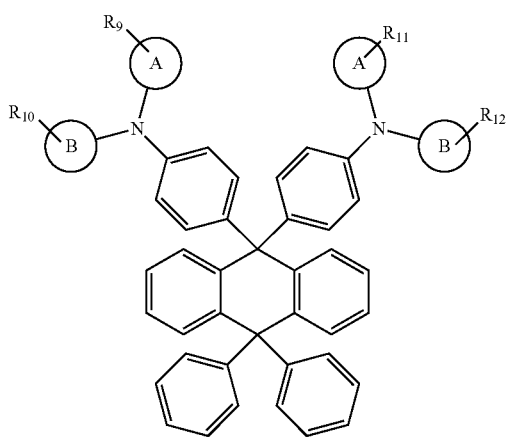

Formula (6)

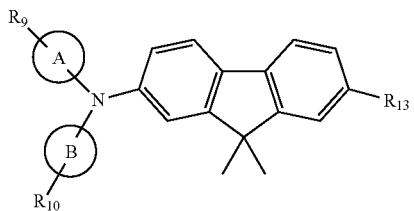

wherein A and B are each independently selected from one of phenyl, naphthyl, and anilino;

$R_9$, $R_{10}$, $R_{11}$ and $R_{12}$ are each independently selected from one of hydrogen and C6-C30 aryl;

$R_{13}$ is selected from one of C1-C6 alkyl and hydroxyl.

In one embodiment, the organic electroluminescent device is an organic electroluminescent device sharing a blue-light electron blocking layer.

According to another aspect of the present disclosure, there is also provided a method for preparing an organic electroluminescent device, including the following steps:

forming a hole injection layer, which includes a first doped layer and/or a second doped layer, wherein the first doped layer includes a P-type dopant, and the second doped layer includes a P-type dopant and a hole transport material;

forming a hole transport layer on the hole injection layer; and forming an electron blocking layer on the hole transport layer, wherein a difference in HOMO energy level between the electron blocking layer and the hole transport layer is less than or equal to 0.2 eV.

In the organic electroluminescent device obtained by the above method for preparing an organic electroluminescent device, the P-type dopant in the first doped layer can increase hole injection amount, thereby increasing the lifetime of the mass production device; in the second doped layer, it can control the hole injection amount by adjusting the doping concentration of the P-type dopant, thereby adjusting the balance of electrons and holes, and increasing the lifetime of mass production device accordingly. Moreover, a difference in HOMO energy level between the electron blocking layer and the hole transport layer is less than or equal to 0.2 eV, which can reduce the power consumption of the organic electroluminescent device, thereby increasing the lifetime of the mass production device.

DETAILED DESCRIPTION OF EMBODIMENTS

Figure 1:
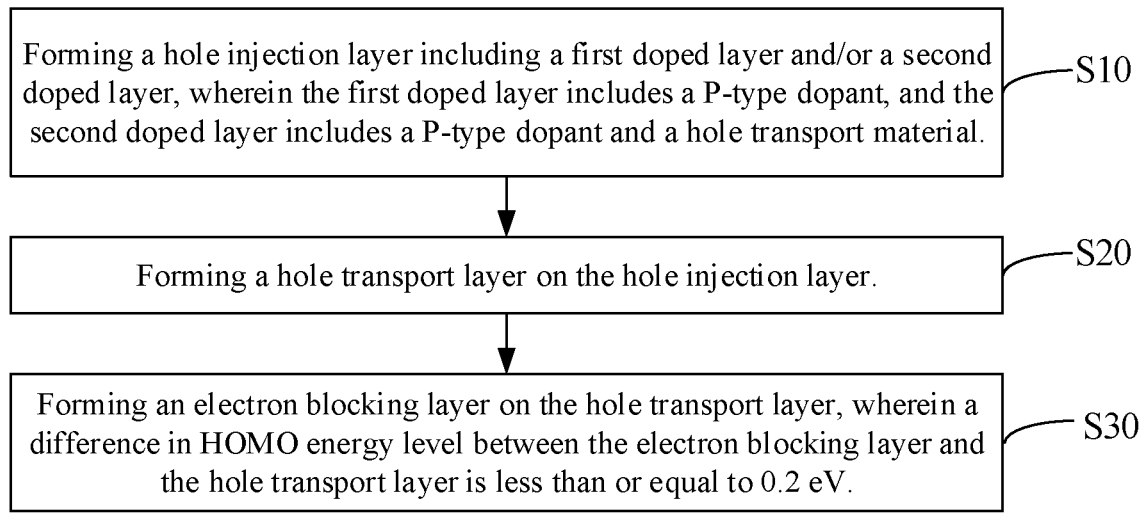
FIG. 1 is a flow chart of a method for preparing an organic electroluminescent device according to an embodiment of the present disclosure.

Reference will be made to the drawings to describe embodiments of the present disclosure in detail, so that the above objects, features and advantages of the present disclosure can be more apparent and understandable. In the following description, numerous specific details are set forth in order to provide a thorough understanding of the present disclosure. However, the present disclosure can be implemented in many other ways different from those described herein, and those skilled in the art can make similar modifications without departing from the disclosure, and therefore, the present disclosure is not limited by the specific embodiments disclosed below.

An organic electroluminescent device of the present disclosure includes: a hole injection layer including a first doped layer and/or a second doped layer, wherein the first doped layer includes a P-type dopant, and the second doped layer includes a P-type dopant and a hole transport material; a hole transport layer formed on the hole injection layer; and an electron blocking layer formed on the hole transport layer; wherein a difference in HOMO (Highest Occupied Molecular Orbital) energy level between the electron blocking layer and the hole transport layer is less than or equal to 0.2 eV.

The organic electroluminescent device of the first embodiment includes an anode, and, sequentially formed on the anode, a hole injection layer, a hole transport layer, an electron blocking layer, an organic light-emitting layer, an electron transport layer and a cathode.

Wherein, the hole injection layer includes a first doped layer. The first doped layer includes a P-type dopant. The P-type dopant can increase the hole injection amount, thereby increasing the lifetime of mass production device.

On the basis of the foregoing embodiment, the hole injection layer includes only the first doped layer. The first doped layer is composed of a P-type dopant. At this time, the first doped layer is consisted of only a P-type dopant, which is more advantageous for increasing the hole injection amount, thereby increasing the lifetime of the mass production device. It should be noted that the P-type dopant in this embodiment may contain a small amount of impurities in the stoichiometric range, and these impurities are negligible.

On the basis of the foregoing embodiment, the P-type dopant is selected from at least one of NDP-2 and NDP-9. NDP-2 and NDP-9 are both purchasable from Novaled, and NDP-9 has a structural formula as follows:

NDP-9

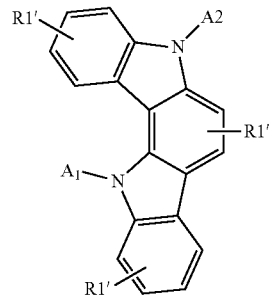

Such a doping material is capable of injecting a large amount of holes, thereby reducing the energy level difference between the anode and the hole transport layer, thereby being advantageous for the holes transferring to the hole transport layer. Certainly, the P-type dopant is not limited to the above embodiments, and may be also selected from other materials capable of reducing the energy level difference between the anode and the hole transport layer.

On the basis of the foregoing embodiments, the first doped layer has a thickness of 5 nm to 20 nm. When the thickness of the first doped layer is 5 nm to 20 nm, on the one hand, the surface of the anode can be effectively covered, thereby eliminating defects caused by rough surface of the anode; on the other hand, the hole injection amount can be regulated, which is more advantageous for the holes transferring to the organic light-emitting layer to co-illuminate with electrons.

It should be noted that, when the hole injection layer includes the first doped layer, the first doped layer may be a layer of P-type dopant, or may be the stack of two or more layers of different P-type dopants.

The hole transport layer is formed on the hole injection layer. The electron blocking layer is formed on the hole transport layer. Wherein, a difference in HOMO energy level between the hole transport layer and the electron blocking layer is less than or equal to 0.2 eV. It can reduce the power consumption of the organic electroluminescent device and thereby increase the lifetime of mass production device.

On the basis of the foregoing embodiments, the material of the hole transport layer is selected from at least one of the structures shown by formula (1) and formula (2):

Formula (1)

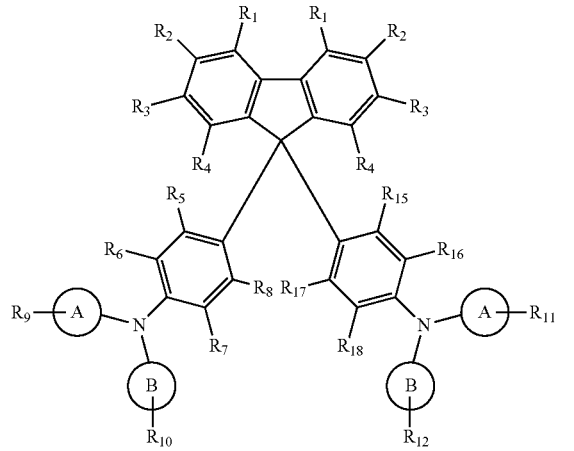

Formula (2)

wherein, A and B in the formula (1) are independently selected from the group consisting of phenyl, naphthyl or anilino;

$R_1$, $R_2$, $R_3$, $R_4$, $R_5$, $R_6$, $R_7$, $R_8$, $R_{15}$, $R_{16}$, $R_{17}$ and $R_{18}$ are each independently selected from one of hydrogen, halogen, CN, $NO_2$, amino, C6-C30 sub-fused ring aryl, C6-C30 sub-fused heterocyclic aryl, C6-C20 alkyl, and C6-C30 alcohol group;

$R_9$, $R_{10}$, $R_{11}$ and $R_{12}$ are each independently selected from one of hydrogen and C6-C30 aryl;

A1 and A2 in the formula (2) are each independently selected from one of C6-C30 aryl and substituted or unsubstituted C6-C30 heterocyclic aryl, and R1' is selected from one of hydrogen, alkyl, alkoxy and base;

and the formula (2) meets the condition that at least one of A1 and A2 has a constricted ring structure, that is, at least one of A1 and A2 has a cyclic structure containing an unsaturated bond.

On the basis of the foregoing embodiment, the material of the hole transport layer is selected from at least one of the structures shown by (HTL1-1)-(HTL1-10):

HTL1-1

HTL1-2

HTL1-3

HTL1-4

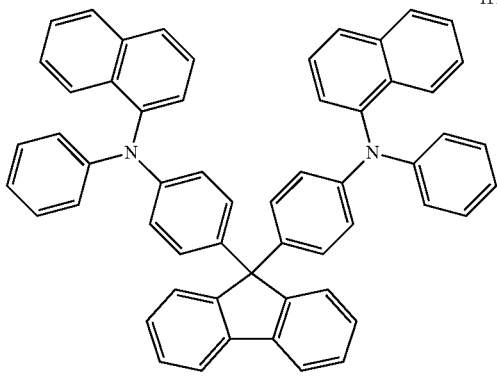

HTL1-5

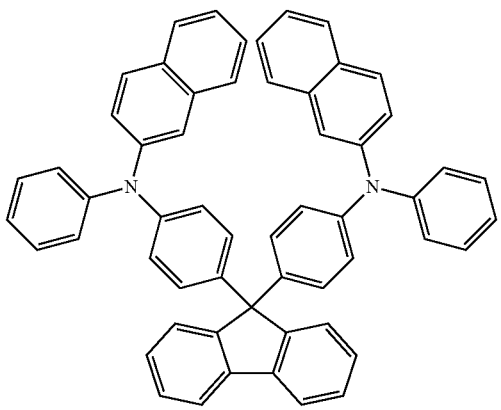

HTL1-6

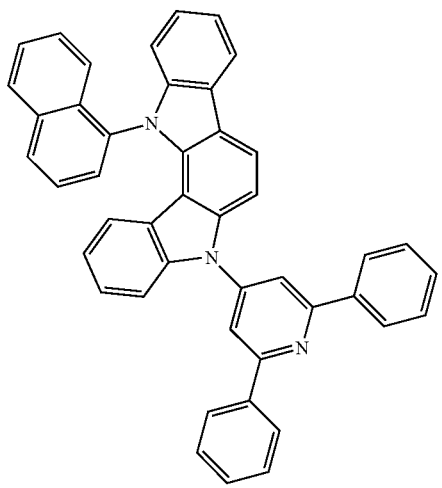

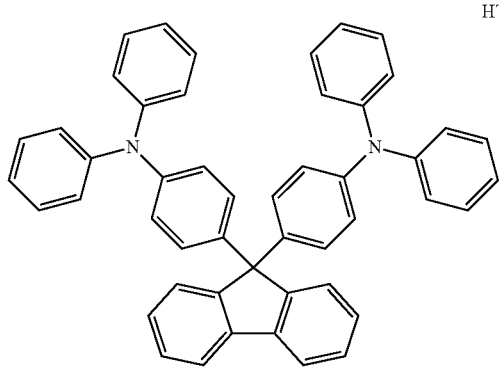

HTL1-7

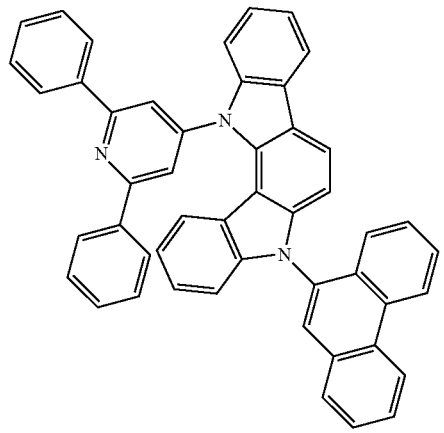

HTL1-8

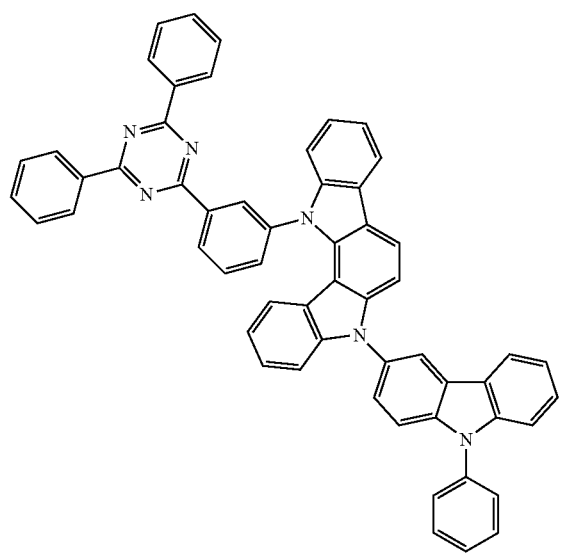

HTL1-9

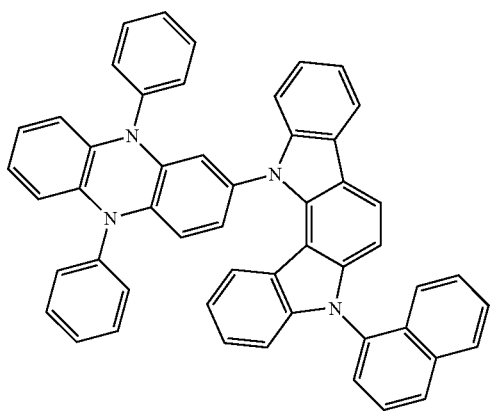

HTL1-10

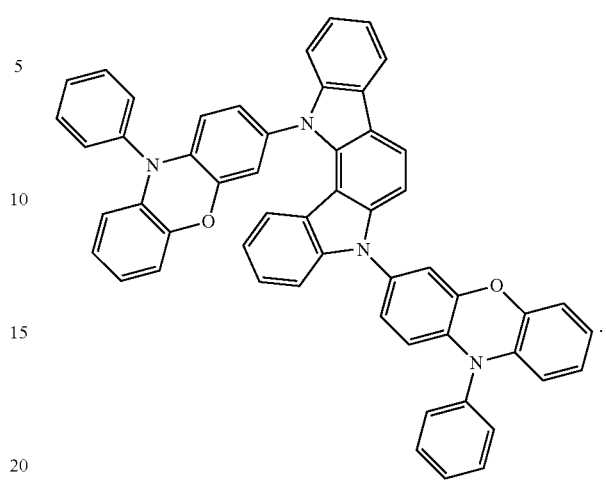

The material of the above-mentioned hole transport layer has good transport characteristics, relatively high mobility, can shorten the difference in the HOMO energy level between the hole transport layer and the electron blocking layer, thereby being more advantageous for the transfer and transport of holes. In addition, the material of the above hole transport layer itself is relatively stable in properties, can be used to prepare a device having relatively stable properties.

It should be noted that the material of the hole transport layer is not limited thereto, and it may be also selected from other materials capable of playing the same role.

On the basis of the foregoing embodiments, the hole transport layer has a thickness of 10 nm to 100 nm. When the thickness of the hole transport layer is 10 nm to 100 nm, it is more advantageous for the hole transport and the adjustment of the optical microcavity.

On the basis of the forgoing embodiment, the material of the electron blocking layer is selected from at least one of the indenofluorene derivatives having structures shown by the formulas (3), (4), (5), and (6):

Formula (3)

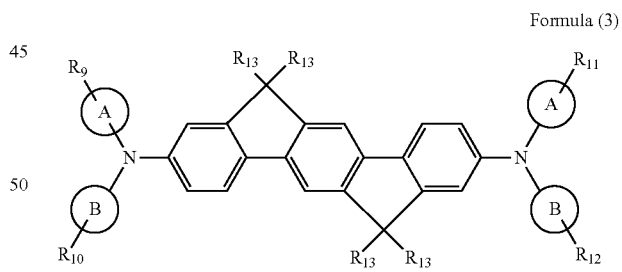

Formula (4)

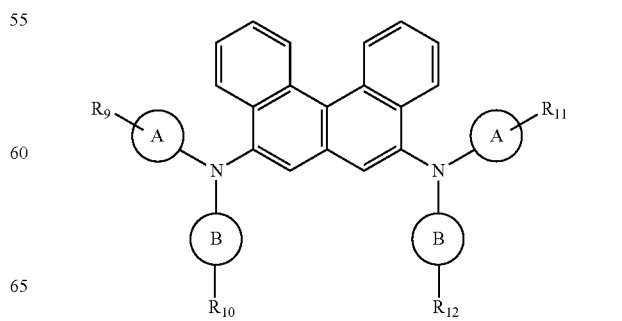

Formula (5)

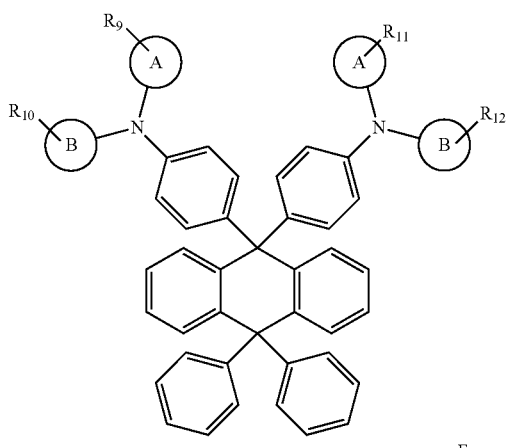

Formula (6)

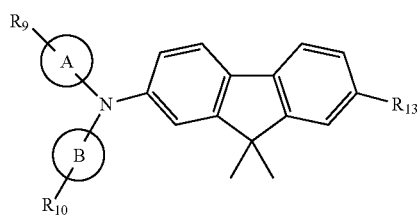

wherein A and B are each independently selected from one of phenyl, naphthyl, and anilino;

$R_9$, $R_{10}$, $R_{11}$ and $R_{12}$ are each independently selected from one of hydrogen and C6-C30 aryl;

$R_{13}$ is selected from one of C1-C6 alkyl and hydroxyl.

On the basis of the foregoing embodiments, the material of the electron blocking layer is selected from at least one of compounds having the following molecular formulas EBL2-1 to EBL2-12:

EBL2-1

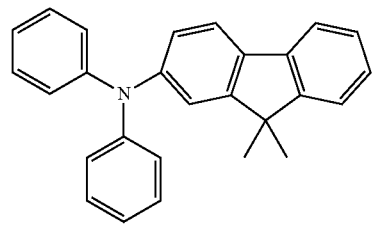

EBL2-2

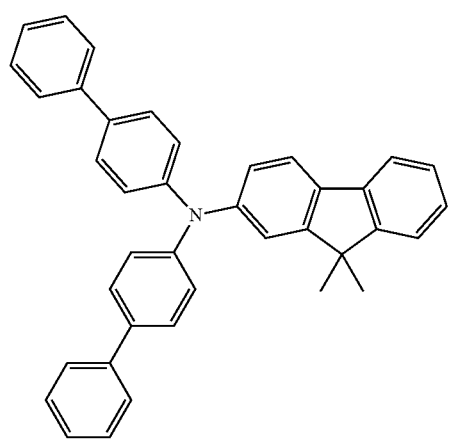

EBL2-3

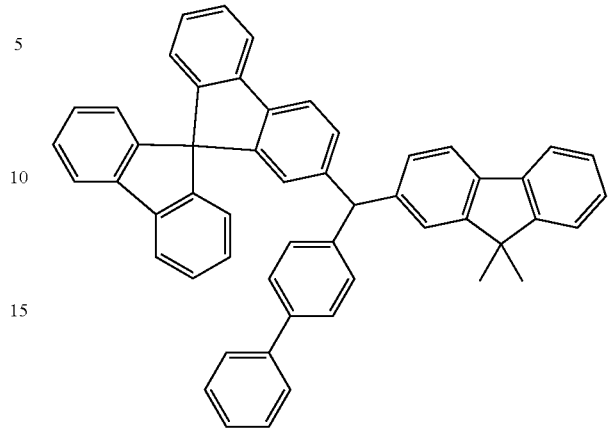

EBL2-4

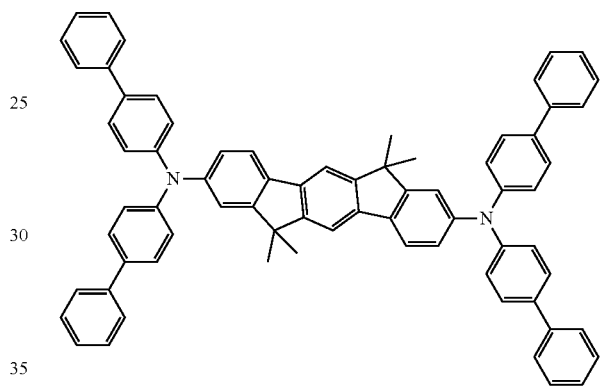

EBL2-5

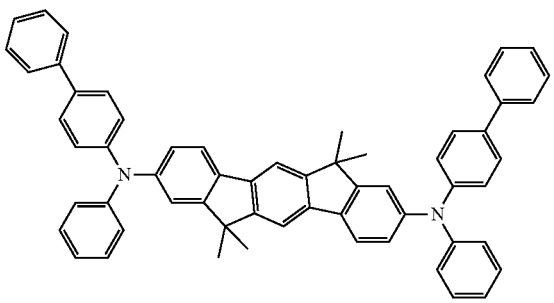

EBL2-6

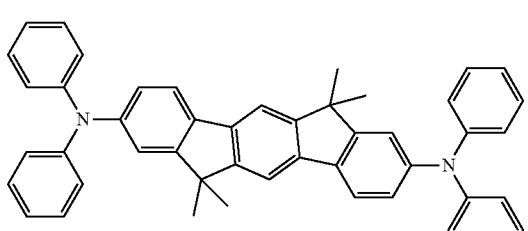

-continued

EBL2-7

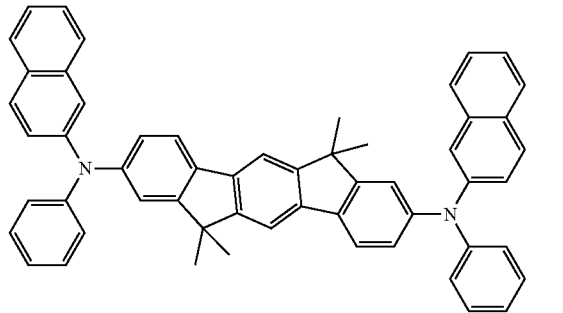

EBL2-8

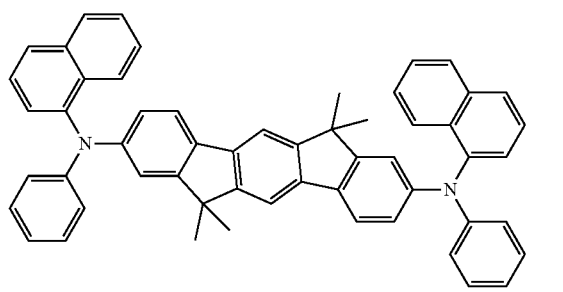

EBL2-9

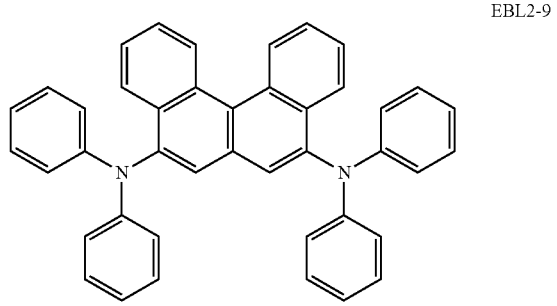

EBL2-10

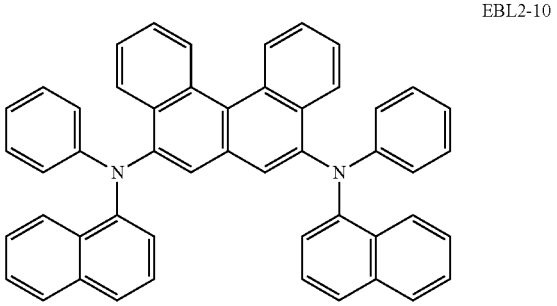

EBL2-11

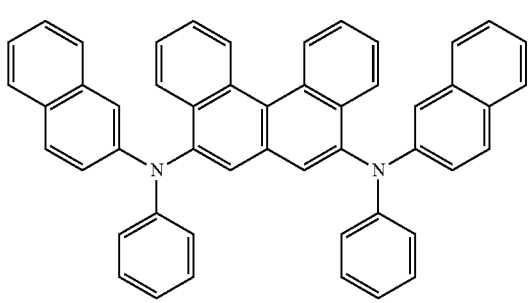

-continued

EBL2-12

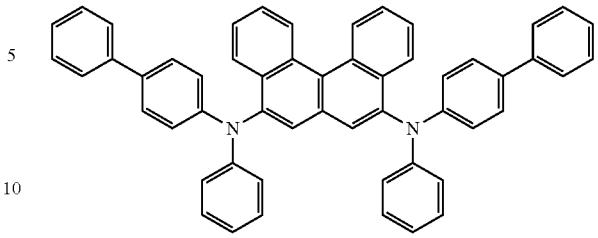

The absolute value of the LUMO energy level of the above material of the electron blocking layer is smaller than the absolute value of the LUMO energy level of the organic light-emitting layer, so that electrons can be blocked in the organic light-emitting layer to improve efficiency.

It should be noted that the material of the electron blocking layer is not limited thereto, and may be also selected from other materials capable of playing the same role.

On the basis of the foregoing embodiments, the electron blocking layer has a thickness of 1 nm to 10 nm. When the thickness of the electron blocking layer is 1 nm to 10 nm, the electrons can be blocked effectively from transporting out of the light-emitting layer and the voltage of the device can be controlled. On the basis of the foregoing embodiments, the organic electroluminescent device is an organic electroluminescent device sharing a blue-light electron blocking layer. At this time, on the one hand, sharing the blue-light electron blocking layer can increase the compensation of red light and blue light; on the other hand, when preparing such organic electroluminescent device sharing the blue-light electron blocking layer, since the blue-light electron blocking layer is a sharing layer, it is only necessary to use a common metal mask (CMM) instead of a fine metal mask (FMM) during steam plating, which is advantageous for simplifying the production process.

In the organic electroluminescent device of the first embodiment, the hole injection layer includes a first doped layer containing a P-type dopant. P-type dopant can increase the hole injection amount, which is advantageous for increasing the lifetime.

The organic electroluminescent device of the second embodiment is different from the organic electroluminescent device of the first embodiment in that the hole injection layer includes a second doped layer. The second doped layer includes a P-type dopant and a hole transport material. It can control hole injection amount by adjusting the doping concentration of the P-type dopant, thereby adjusting the balance of electrons and holes, and increasing the lifetime of mass production device accordingly.

On the basis of the foregoing embodiments, the hole injection layer is consisted of a second doped layer. The second doped layer is consisted of a P-type dopant and a hole transport material. At this time, the second doped layer includes only a P-type dopant and a hole transport material, which is more advantageous for controlling the hole injection amount, thereby adjusting the balance of electrons and holes, and increasing the lifetime of the mass production device accordingly. It should be noted that both the P-type dopant and the hole transport material in this embodiment may include a small amount of impurities in the stoichiometric range, and these impurities are negligible.

On the basis of the foregoing embodiment, in the second doped layer, the P-type dopant has a doping concentration of 3 wt % to 8 wt %. When the doping concentration of the P-type dopant is 3 wt % to 8 wt %, the balance between lifetime and efficiency for the device can be effectively adjusted.

On the basis of the foregoing embodiments, the second doped layer has a thickness of 10 nm to 30 nm. When the thickness of the second doped layer is 10 nm to 30 nm, hole injection can be ensured, thereby effectively adjusting the balance between the lifetime and the efficiency of the device.

On the basis of the foregoing embodiments, the hole transport material is selected from at least one of the structures shown by formula (1) and formula (2):

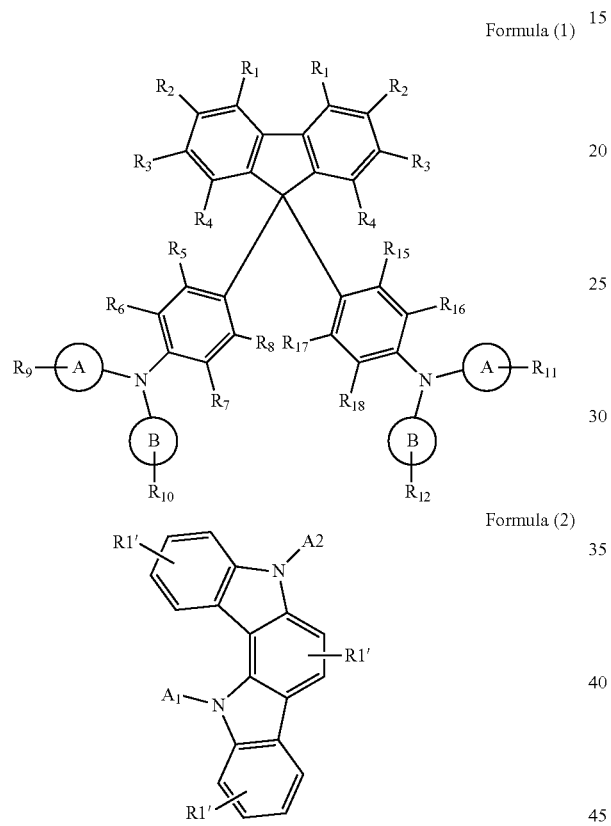

Formula (1)

Formula (2)

wherein, A and B in the formula (1) are each independently selected from the group consisting of phenyl, naphthyl or anilino;

$R_1$, $R_2$, $R_3$, $R_4$, $R_5$, $R_6$, $R_7$, $R_8$, $R_{15}$, $R_{16}$, $R_{17}$ and $R_{18}$ are each independently selected from one of hydrogen, halogen, CN, $NO_2$, amino, C6-C30 sub-fused ring aryl, C6-C30 sub-fused heterocyclic aryl, C6-C20 alkyl, and C6-C30 alcohol group;

$R_9$, $R_{10}$, $R_{11}$ and $R_{12}$ are each independently selected from one of hydrogen and C6-C30 aryl;

A1 and A2 in the formula (2) are each independently selected from one of C6-C30 aryl and substituted or unsubstituted C6-C30 heterocyclic aryl, and R1' is selected from one of hydrogen, alkyl, alkoxy and base;

and the formula (2) meets the condition that at least one of A1 and A2 has a constricted ring structure.

On the basis of the foregoing embodiments, the hole transport material is selected from at least one of the structures shown by (HTL1-1)-(HTL1-10):

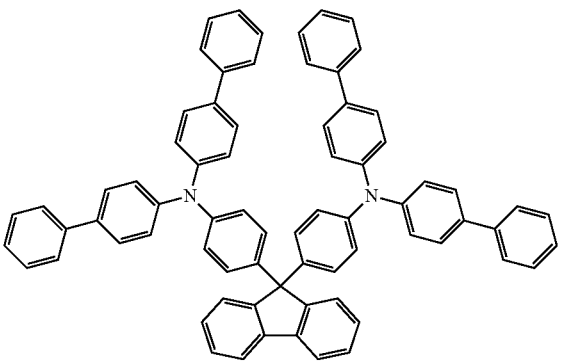

HTL1-1

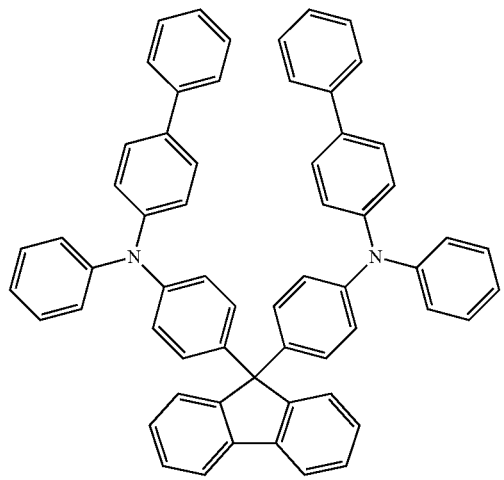

HTL1-2

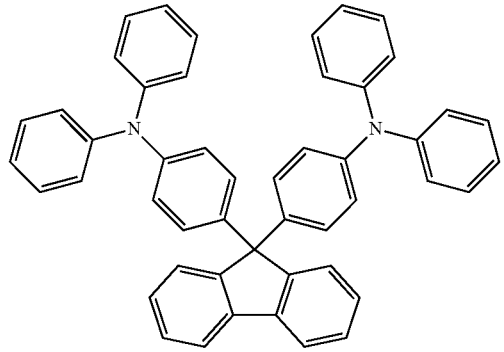

HTL1-3

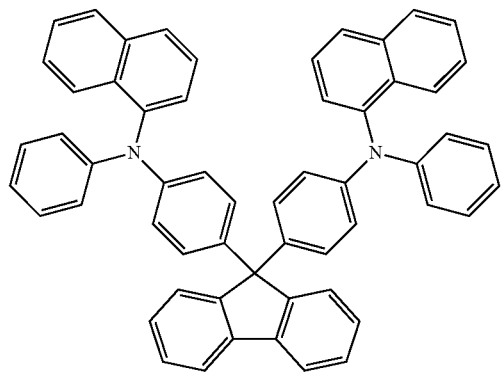

HTL1-4

-continued
HTL1-5
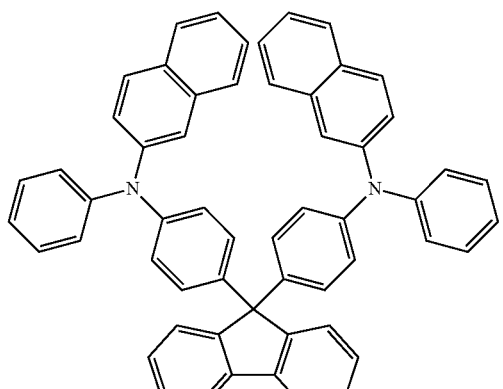
HTL1-6
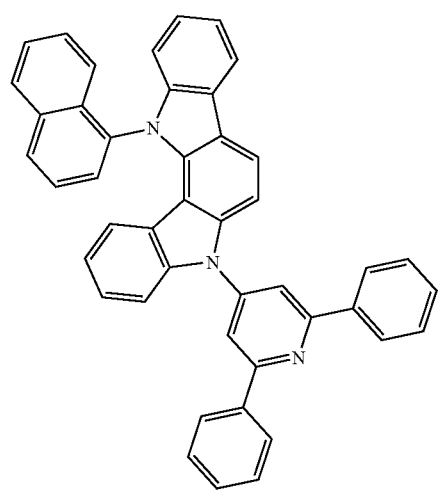
HTL1-7
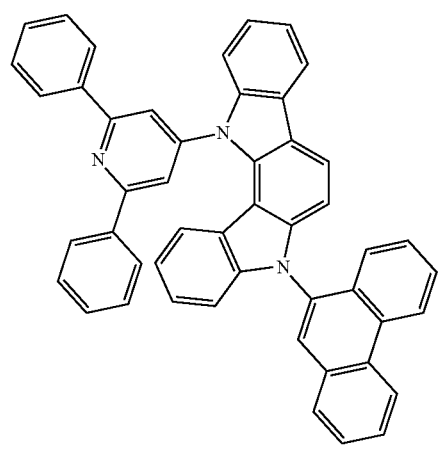
HTL1-8
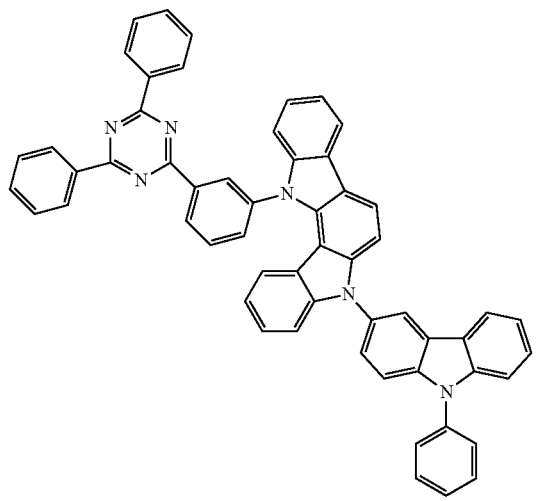
HTL1-9
HTL1-10
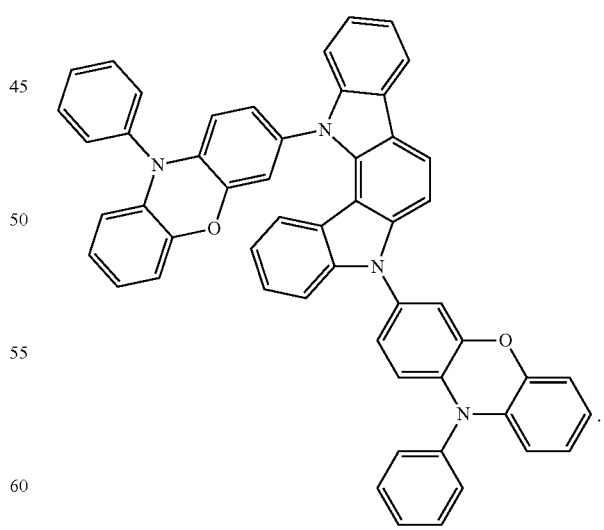
The above hole transport material has good transport characteristics, relatively high mobility, thereby being more advantageous for the transfer and transport of holes. In addition, the above hole transport material itself is relatively stable in properties, can be used to prepare a device having relatively stable properties.

It should be noted that the hole transport material is not limited thereto, and may be also selected from other materials capable of playing the same role.

In addition, it should be noted that, in a same organic electroluminescent device, the hole transport material of the second doped layer and the material of the hole transport layer may be the same or different.

In addition, when the hole injection layer includes the second doped layer, the second doped layer may be one layer, or may be two or more layers, and the doping concentration of each layer may be the same or different.

In the organic electroluminescent device of the second embodiment, since the relatively expensive P-type dopant is doped at low concentration, the production cost is low. In addition, the doping concentration can be adjusted to control the device properties, and the process of mass production can be simplified, which is advantageous for increasing production capacity.

The organic electroluminescent device of the third embodiment is different from the organic electroluminescent devices of the first embodiment and the second embodiment in that the hole injection layer includes a first doped layer and a second doped layer formed on the first doped layer, the second doped layer is adjacent to the hole transport layer.

On the basis of the foregoing embodiment, the first doped layer has a thickness of 1 nm to 10 nm, and the second doped layer has a thickness of 10 nm to 20 nm.

The organic electroluminescent device of the third embodiment is capable of adjusting the hole injection amount, and at the same time, increasing the efficiency and lifetime of the device. The organic electroluminescent device of the fourth embodiment is different from the organic electroluminescent device of the third embodiment in that the hole injection layer includes a second doped layer and a first doped layer formed on the second doped layer, the first doped layer is adjacent to the hole transport layer.

On the basis of the foregoing embodiment, the first doped layer has a thickness of 1 nm to 10 nm, and the second doped layer has a thickness of 10 nm to 20 nm.

The organic electroluminescent device of the fourth embodiment is capable of adjusting the hole injection amount, and at the same time, increasing the efficiency and lifetime of the device.

It should be noted that, when the hole injection layer includes the first doped layer and the second doped layer, the number of layers of the first doped layer and the second doped layer may be set arbitrarily, and relative positions between the two are stacked arbitrarily, for example, the first doped layer and the second doped layer may be alternately stacked or may be not alternately stacked.

In the above organic electroluminescent device, the P-type dopant in the first doped layer can increase hole injection amount, thereby increasing the lifetime of the mass production device; in the second doped layer, it can control hole injection amount by adjusting the doping concentration of the P-type dopant, thereby adjusting the balance of electrons and holes, and then increasing the lifetime of mass production device. Moreover, a difference in HOMO energy level between the electron blocking layer and the hole transport layer is less than or equal to 0.2 eV, which can reduce the power consumption of the organic electroluminescent device, thereby increasing the lifetime of the mass production device.

Referring to FIG. 1, a method for preparing an organic electroluminescent device according to an embodiment includes the following steps:

S10: Forming a hole injection layer including a first doped layer and/or a second doped layer, wherein the first doped layer includes a P-type dopant, and the second doped layer includes a P-type dopant and a hole transport material.

S20: Forming a hole transport layer on the hole injection layer of step S10.

The hole transport layer was formed on the hole injection layer by steam plating.

S30: Forming an electron blocking layer on the hole transport layer of step S20; wherein, a difference in HOMO energy level between the electron blocking layer and the hole transport layer is less than or equal to 0.2 eV.

The electron blocking layer was formed on the hole transport layer by steam plating.

In the organic electroluminescent device obtained by the above method for preparing an organic electroluminescent device, the P-type dopant in the first doped layer can increase hole injection amount, thereby increasing the lifetime of the mass production device; in the second doped layer, it can control hole injection amount by adjusting the doping concentration of the P-type dopant, thereby adjusting the balance of electrons and holes, and increasing the lifetime of mass production device accordingly. Moreover, a difference in HOMO energy level between the electron blocking layer and the hole transport layer is less than or equal to 0.2 eV, which can reduce the power consumption of the organic electroluminescent device, thereby increasing the lifetime of the mass production device.

The organic electroluminescent device of the present disclosure will be further described below in conjunction with specific embodiments and the accompanying drawings.

Example 1

Figure 2:
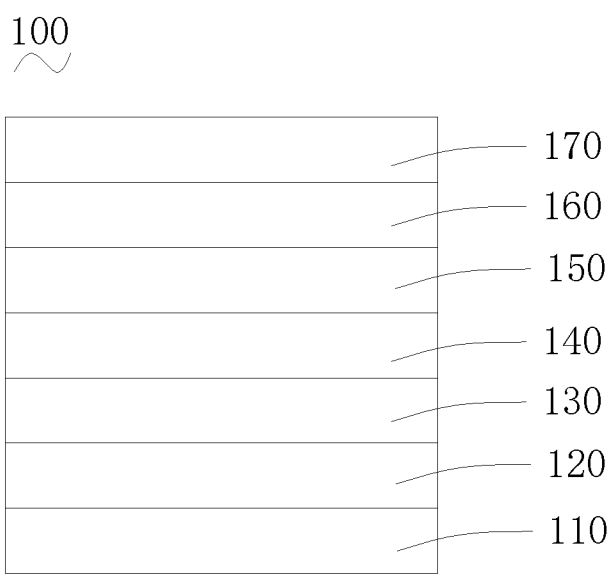
FIG. 2 is a schematic diagram of an organic electroluminescent device of Example 1.

Referring to FIG. 2, the organic electroluminescent device 100 of Example 1 includes an anode 110, and, sequentially formed on the anode 110, a hole injection layer 120, a hole transport layer 130, an electron blocking layer 140, an organic light-emitting layer 150, an electron transport layer 160 and a cathode 170.

Wherein, the hole injection layer 120 is composed of a first doped layer. The first doped layer is composed of NDP-9. The material of the hole transport layer 130 is HTL1-2 (the structure is as shown above). The material of the electron blocking layer 140 is EBL2-2 (the structure is as shown above). In this Example, the energy level difference between the hole transport layer 130 and the electron blocking layer 140 is 0.15 eV.

In addition, the materials of the anode 110, the electron blocking layer 140, the organic light-emitting layer 150, the electron transport layer 160 and the cathode 170 are ITO, EBL2-2 (the structure is as shown above), Ir(ppy)$_3$, ETL1-1 (the structure is as shown above) and Mg/Ag in order.

The thicknesses of the anode 110, the hole injection layer 120, the hole transport layer 130, the electron blocking layer 140, the organic light-emitting layer 150, the electron transport layer 160 and the cathode 170 are 10 nm, 10 nm, 100 nm, 5 nm, 30 nm, 30 nm and 20 nm in order.

Example 2

Figure 3:
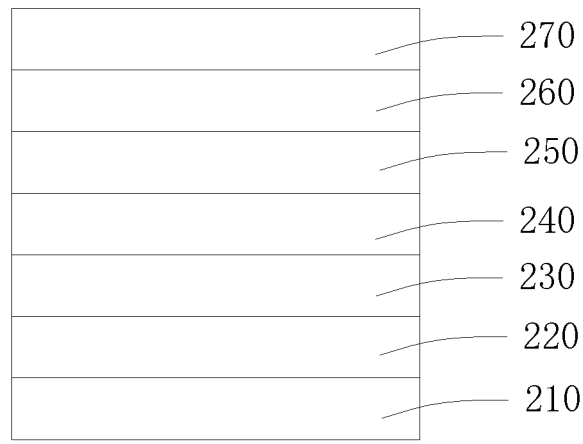
FIG. 3 is a schematic diagram of an organic electroluminescent device of Example 2.

Referring to FIG. 3, the organic electroluminescent device 200 of Example 2 includes an anode 210, and, sequentially formed on the anode 210, a hole injection layer 220, a hole transport layer 230, an electron blocking layer 240, an organic light-emitting layer 250, an electron transport layer 260 and a cathode 270.

Wherein, the hole injection layer 220 is composed of a second doped layer. The second doped layer is composed of NDP-9 and HTL1-2 (the structure is as shown above), and in the second doped layer, the P-type dopant has a doping concentration of 3 wt %.

The material of the hole transport layer 230 is HTL1-2 (the structure is as shown above). The material of the electron blocking layer 240 is EBL2-2 (the structure is as shown above). In this Example, the energy level difference between the hole transport layer 230 and the electron blocking layer 240 is 0.15 eV.

In addition, the materials of the anode 210, the electron blocking layer 240, the organic light-emitting layer 250, the electron transport layer 260 and the cathode 270 are ITO, EBL2-2 (the structure is as shown above), Ir(ppy)$_3$, ETL1-1 (the structure is as shown above) and Mg/Ag in order.

The thicknesses of the anode 210, the hole injection layer 220, the hole transport layer 230, the electron blocking layer 240, the organic light emitting layer 250, the electron transport layer 260 and the cathode 270 are 10 nm, 10 nm, 100 nm, 5 nm, 30 nm, 30 nm and 20 nm in order.

Example 3

This Example is different from Example 2 in that the P-type dopant in the second doped layer has a doping concentration of 5 wt %.

Example 4

This Example is different from Example 2 in that the P-type dopant in the second doped layer has a doping concentration of 7 wt %.

Example 5

Figure 4:
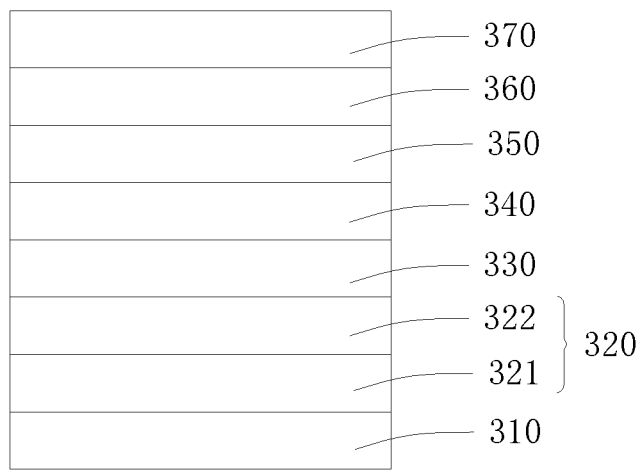
FIG. 4 is a schematic diagram of an organic electroluminescent device of Example 5.

Referring to FIG. 4, the organic electroluminescent device 300 of Example 5 includes an anode 310, and, sequentially formed on the anode 310, a hole injection layer 320, a hole transport layer 330, an electron blocking layer 340, an organic light-emitting layer 350, an electron transport layer 360 and a cathode 370.

Wherein, the hole injection layer 320 includes a first doped layer 321 and a second doped layer 322. The first doped layer 321 is formed on the anode 310, and the second doped layer 322 is formed on the first doped layer 321. The first doped layer 321 is composed of NDP-9. The second doped layer 322 is composed of NDP-9 and HTL1-2 (the structure is as shown above), and in the second doped layer 322, the P-type dopant has a doping concentration of 5 wt %.

The material of the hole transport layer 330 is HTL1-2 (the structure is as shown above). The material of the electron blocking layer 340 is EBL2-2 (the structure is as shown above). In this Example, the energy level difference between the hole transport layer 330 and the electron blocking layer 340 is 0.15 eV.

In addition, the materials of the anode 310, the electron blocking layer 340, the organic light-emitting layer 350, the electron transport layer 360 and the cathode 370 are ITO, EBL2-2 (the structure is as shown above), Ir(ppy)$_3$, ETL1-1 (the structure is as shown above) and Mg/Ag in order.

The thicknesses of the anode 310, the hole injection layer 320, the hole transport layer 330, the electron blocking layer 340, the organic light-emitting layer 350, the electron transport layer 360 and the cathode 370 are 10 nm, 20 nm, 100 nm, 5 nm, 30 nm, 30 nm and 20 nm in order. Wherein, the thicknesses of the first doped layer 321 and the second doped layer 322 are 10 nm and 10 nm, respectively.

Example 6

Figure 5:
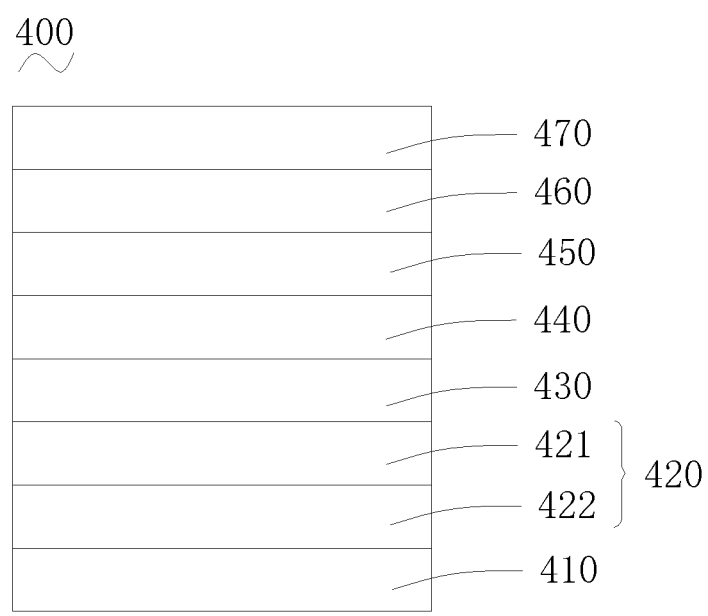
FIG. 5 is a schematic diagram of an organic electroluminescent device of Example 6.

Referring to FIG. 5, the organic electroluminescent device 400 of Example 6 includes an anode 410, and, sequentially formed on the anode 410, a hole injection layer 420, a hole transport layer 430, an electron blocking layer 440, an organic light-emitting layer 450, an electron transport layer 460 and a cathode 470.

Wherein, the hole injection layer 420 includes a first doped layer 421 and a second doped layer 422. The second doped layer 422 is formed on the anode 410, and the first doped layer 421 is formed on the second doped layer 422. The first doped layer 421 is composed of NDP-9. The second doped layer 422 is composed of NDP-9 and HTL1-2 (the structure is as shown above), and in the second doped layer 422, the P-type dopant has a doping concentration of 5 wt %.

The material of the hole transport layer 430 is HTL1-2 (the structure is as shown above). The material of the electron blocking layer 440 is EBL2-2 (the structure is as shown above). In this Example, the energy level difference between the hole transport layer 430 and the electron blocking layer 440 is 0.15 eV.

In addition, the materials of the anode 410, the electron blocking layer 440, the organic light-emitting layer 450, the electron transport layer 460 and the cathode 470 are ITO, EBL2-2 (the structure is as shown above), Ir(ppy)$_3$, ETL1-1 (the structure is as shown above) and Mg/Ag in order.

The thicknesses of the anode 410, the hole injection layer 420, the hole transport layer 430, the electron blocking layer 440, the organic light-emitting layer 450, the electron transport layer 460 and the cathode 470 are 10 nm, 20 nm, 100 nm, 5 nm, 30 nm, 30 nm and 20 nm in order. The thicknesses of the first doped layer 421 and the second doped layer 422 are 10 nm and 10 nm, respectively.

Example 7

Referring to the structure of the organic electroluminescent device 400 in Example 1, this Example is different from Example 1 in that the first doped layer is composed of NDP-2.

Comparative Example 1

Comparative Example 1 is different from Example 2 in that the hole injection layer does not include a P-type dopant and is composed only of HAT-CN.

Test Experiments

The organic electroluminescent devices of Examples 1-7 and Comparative Example 1 were tested under the condition of 1000 nit luminance. The photoelectric properties are shown in the table below:

| Number | Condition | Required luminance (cd/m²) | Voltage (V) | Current efficiency (cd/A) | CIE-x | CIE-y | LT97 (h) |
|---|---|---|---|---|---|---|---|
| Comparative Example 1 | / | 10000 | 4.07 | 112.05 | 0.2191 | 0.7272 | 500 |
| Example 1 | / | 10000 | 3.60 | 110.95 | 0.2210 | 0.7260 | >1000 |
| Example 2 | P-type dopant (3 wt %) | | 4.10 | 112.72 | 0.232 | 0.7229 | >1000 |
| Example 3 | P-type dopant (5 wt %) | | 3.65 | 114.76 | 0.2443 | 0.7175 | >1000 |
| Example 4 | P-type dopant (7 wt %) | | 3.58 | 113.61 | 0.2433 | 0.7169 | >1000 |
| Example 5 | P-type dopant (5 wt %) | | 3.61 | 113.15 | 0.2400 | 0.7180 | >1000 |
| Example 6 | P-type dopant (5 wt %) | | 3.7 | 112.56 | 0.2322 | 0.7210 | >1000 |
| Example 7 | / | | 3.66 | 110.15 | 0.2120 | 0.726 | >1000 |

It can be seen from the above test results that:

Firstly, the values of chromaticity (CIE) and luminance of Examples 1-7 and Comparative Example 1 were similar, which indicates that it is meaningful to compare the numerical values of the above test results.

Secondly, under the same test conditions, the current efficiency of Comparative Example 1 is 112.05, the current efficiencies of Examples 1 and 7 are similar to that of Comparative Example 1, which are 110.95 and 110.15, respectively, and can meet the current efficiency requirements of organic electroluminescent devices. The current efficiencies of the Examples 2-6 of the present disclosure are 112.72, 114.76, 113.61, 113.15 and 112.56, respectively. That is, the current efficiencies of the Examples 2-6 of the present disclosure are all greater than the current efficiency of the Comparative Example 1. This indicates that the organic electroluminescent devices of Examples 2, 3, 4, 5 and 6 of the present disclosure have relatively high current efficiencies.

Again, under the same test conditions, the LT97 of Comparative Example 1 is 500 h, while the LT97 of Examples 1-7 of the present disclosure are all greater than 1000 h. That is, the LT97 of Examples 1-7 of the present disclosure is twice or more than twice the LT97 of Comparative Example 1. This indicates that the organic electroluminescent devices of Examples 1-7 of the present disclosure have a relatively long lifetime.

In summary, the organic electroluminescent device of the present disclosure not only has a relatively high current efficiency, but also has a relatively long lifetime, which meets the requirement for mass production, and is more advantageous for application.

The technical features of the above-described embodiments may be combined arbitrarily. To simplify the description, all the possible combinations of the technical features in the above embodiments are not described. However, all of the combinations of these technical features should be considered as within the scope of the disclosure, as long as such combinations do not contradict with each other.

The above-described embodiments merely represent several embodiments of the present disclosure, and the description thereof is more specific and detailed, but it should not be construed as limiting the scope of the present disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

The invention claimed is:

1. An organic electroluminescent device, comprising:
   a hole injection layer including a first doped layer and/or a second doped layer, the first doped layer including a P-type dopant, and the second doped layer including a P-type dopant and a hole transport material;
   a hole transport layer formed on the hole injection layer; and
   an electron blocking layer formed on the hole transport layer, a difference in HOMO energy level between the electron blocking layer and the hole transport layer being less than or equal to 0.2 eV;
   wherein a material of the electron blocking layer is selected from at least one of the compounds with a structure shown by the formulas (3), (4), (5), and (6):

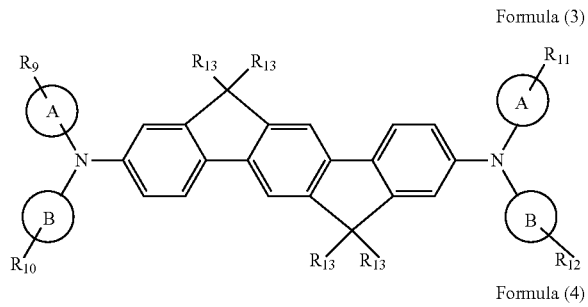

Formula (3)

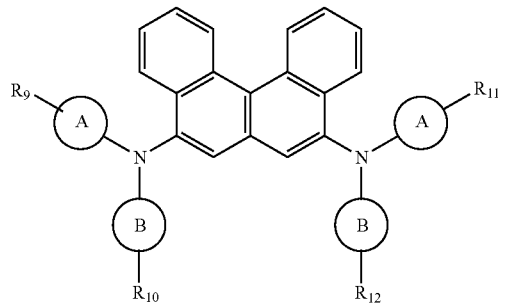

Formula (4)

-continued

Formula (5)

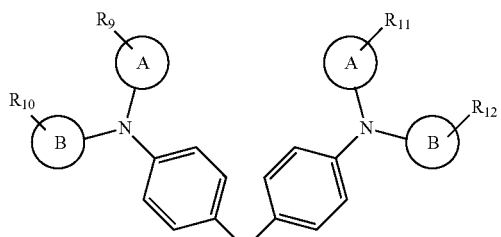

Formula (6)

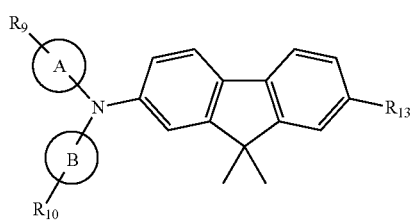

wherein A and B are respectively selected from one of phenyl, naphthyl, and anilino;

wherein $R_9$, $R_{10}$, $R_{11}$ and $R_{12}$ are respectively selected from one of hydrogen and C6-C30 aryl; and wherein $R_{13}$ is selected from one of C1-C6 alkyl and hydroxyl.

2. The organic electroluminescent device of claim 1, wherein in the second doped layer, the P-type dopant has a doping concentration from 3 wt % to 8 wt %.

3. The organic electroluminescent device of claim 1, wherein the hole injection layer comprises the first doped layer and the second doped layer formed on the first doped layer, and the second doped layer is adjacent to the hole transport layer.

4. The organic electroluminescent device of claim 1, wherein the hole injection layer comprises the second doped layer and the first doped layer formed on the second doped layer, and the first doped layer is adjacent to the hole transport layer.

5. The organic electroluminescent device of claim 1, wherein when the hole injection layer comprises only the first doped layer, the first doped layer has a thickness from 5 nm to 20 nm;

when the hole injection layer comprises only the second doped layer, the second doped layer has a thickness from 10 nm to 30 nm;

when the hole injection layer comprises the first doped layer and the second doped layer simultaneously, the first doped layer has a thickness from 1 nm to 10 nm, and the second doped layer has a thickness from 10 nm to 20 nm.

6. The organic electroluminescent device of claim 1, wherein the hole transport material and the material of the hole transport layer are respectively selected from at least one of the structures shown by the formulas (1) and (2):

Formula (1)

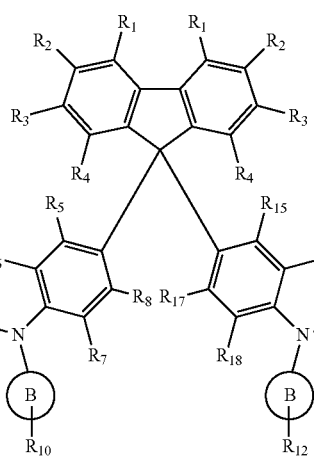

Formula (2)

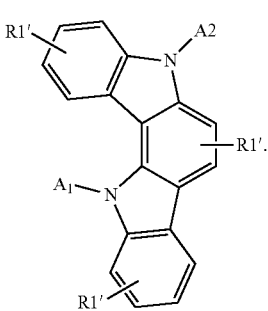

A and B in the formula (1) are each respectively selected from the group consisting of phenyl, naphthyl or anilino;

$R_1$, $R_2$, $R_3$, $R_4$, $R_5$, $R_6$, $R_7$, $R_8$, $R_{15}$, $R_{16}$, $R_{17}$ and $R_{18}$ are respectively selected from one of hydrogen, halogen, CN, $NO_2$, amino, C6-C30 sub-fused ring aryl, C6-C30 sub-fused heterocyclic aryl, C6-C20 alkyl, and C6-C30 alcohol group;

$R_9$, $R_{10}$, $R_{11}$ and $R_{12}$ are respectively selected from one of hydrogen and C6-C30 aryl;

A1 and A2 in the formula (2) are respectively selected from one of C6-C30 aryl and substituted or unsubstituted C6-C30 heterocyclic aryl, and $R_1'$ is selected from one of hydrogen, alkyl, alkoxy and base;

and the formula (2) meets a condition that at least one of A1 and A2 has a cyclic structure containing an unsaturated bond.

7. A method for preparing an organic electroluminescent device, comprising:

forming a hole injection layer including a first doped layer and/or a second doped layer, the first doped layer including a P-type dopant, and the second doped layer including a P-type dopant and a hole transport material;

forming a hole transport layer on the hole injection layer; and forming an electron blocking layer on the hole transport layer, a difference in HOMO energy level between the electron blocking layer and the hole transport layer being less than or equal to 0.2 eV;

wherein a material of the electron blocking layer is selected from at least one of the compounds with a structure shown by the formulas (3), (4), (5), and (6):

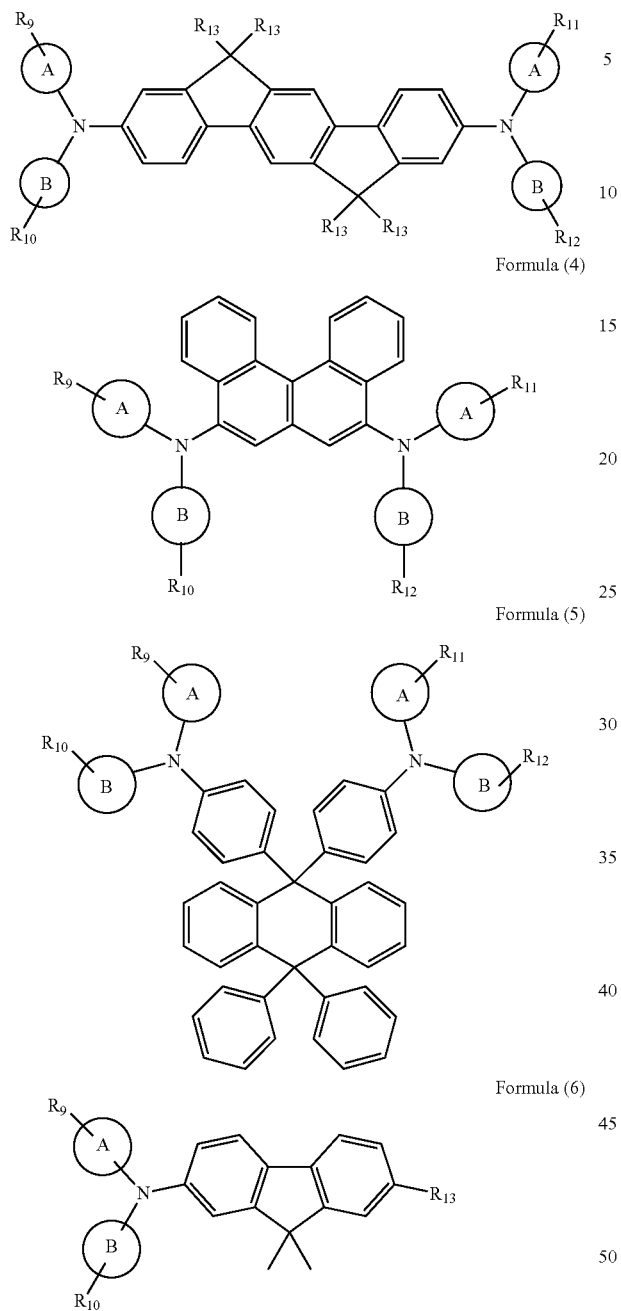

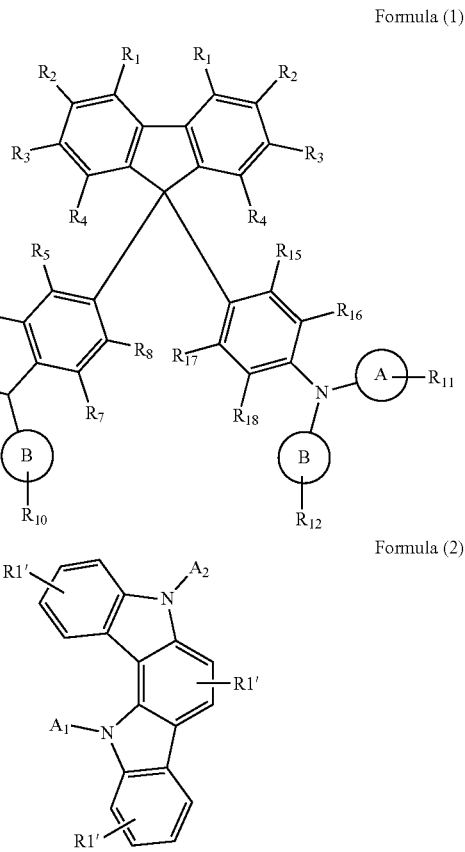

wherein A and B are respectively selected from one of phenyl, naphthyl, and anilino;

wherein $R_9$, $R_{10}$, $R_{11}$ and $R_{12}$ are respectively selected from one of hydrogen and C6-C30 aryl; and wherein $R_{13}$ is selected from one of C1-C6 alkyl and hydroxyl.

8. An organic electroluminescent device, comprising:

a hole injection layer including a first doped layer and/or a second doped layer, the first doped layer including a P-type dopant, and the second doped layer including a P-type dopant and a hole transport material;

a hole transport layer formed on the hole injection layer; and an electron blocking layer formed on the hole transport layer, a difference in HOMO energy level between the electron blocking layer and the hole transport layer being less than or equal to 0.2 eV;

wherein the hole transport material and the material of the hole transport layer are respectively selected from at least one of the structures shown by the formulas (1) and (2).

A and B in the formula (1) are each respectively selected from the group consisting of phenyl, naphthyl or anilino;

$R_1$, $R_2$, $R_3$, $R_4$, $R_5$, $R_6$, $R_7$, $R_8$, $R_{15}$, $R_{16}$, $R_{17}$ and $R_{18}$ are respectively selected from one of hydrogen, halogen, CN, NO2, amino, C6-C30 sub-fused ring aryl, C6-C30 sub-fused heterocyclic aryl, C6-C20 alkyl, and C6-C30 alcohol group;

$R_9$, $R_{10}$, $R_{11}$ and $R_{12}$ are respectively selected from one of hydrogen and C6-C30 aryl;

A1 and A2 in the formula (2) are respectively selected from one of C6-C30 aryl and substituted or unsubstituted C6-C30 heterocyclic aryl, and $R_1{'}$ is selected from one of hydrogen, alkyl, alkoxy and base;

and the formula (2) meets a condition that at least one of A1 and A2 has a cyclic structure containing an unsaturated bond.

9. The organic electroluminescent device of claim 8, wherein in the second doped layer, the P-type dopant has a doping concentration from 3 wt % to 8 wt %.

10. The organic electroluminescent device of claim 8, wherein the hole injection layer comprises the first doped layer and the second doped layer formed on the first doped layer, and the second doped layer is adjacent to the hole transport layer.

11. The organic electroluminescent device of claim 8, wherein the hole injection layer comprises the second doped layer and the first doped layer formed on the second doped layer, and the first doped layer is adjacent to the hole transport layer.

12. The organic electroluminescent device of claim 8, wherein when the hole injection layer comprises only the first doped layer, the first doped layer has a thickness from 5 nm to 20 nm;
- when the hole injection layer comprises only the second doped layer, the second doped layer has a thickness from 10 nm to 30 nm;
- when the hole injection layer comprises the first doped layer and the second doped layer simultaneously, the first doped layer has a thickness from 1 nm to 10 nm, and the second doped layer has a thickness from 10 nm to 20 nm.

\* \* \* \* \*